United States Patent
Park et al.

(10) Patent No.: US 6,712,078 B2
(45) Date of Patent: Mar. 30, 2004

(54) APPARATUS FOR CLEANING SEMICONDUCTOR WAFER AND METHOD FOR CLEANING WAFER USING THE SAME

(75) Inventors: Im-soo Park, Seoul (KR); Kun-tack Lee, Suwon (KR); Yong-pil Han, Seoul (KR); Sang-rok Hah, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 149 days.

(21) Appl. No.: 09/899,226

(22) Filed: Jul. 6, 2001

(65) Prior Publication Data

US 2002/0092542 A1 Jul. 18, 2002

(30) Foreign Application Priority Data

Jan. 13, 2001 (KR) ........................................ 2001-2065 U

(51) Int. Cl.[7] ........................... B08B 7/04; H01L 21/306
(52) U.S. Cl. ........................ 134/1.3; 134/35; 134/105; 134/148; 134/902
(58) Field of Search ..................... 134/1.3, 35, 30, 134/105, 107, 153, 148, 902

(56) References Cited

U.S. PATENT DOCUMENTS

| | | | |
|---|---|---|---|
| 4,871,417 A | * 10/1989 | Nishizawa et al. | 438/748 |
| 5,695,570 A | * 12/1997 | Douglas | 134/1.3 |
| 6,190,458 B1 | * 2/2001 | Harada | 118/715 |
| 6,495,215 B1 | * 12/2002 | Kamikawa | 427/541 |

FOREIGN PATENT DOCUMENTS

JP (12) 2000-012500 1/2000

* cited by examiner

Primary Examiner—Frankie L. Stinson
Assistant Examiner—Saeed Chaudhry
(74) Attorney, Agent, or Firm—Lee & Sterba, P.C.

(57) ABSTRACT

An apparatus for cleaning a semiconductor wafer and method for cleaning a wafer using the same wherein, the apparatus includes a chamber on which a wafer is mounted, a revolving chuck mounted in the chamber for supporting and fixing the wafer, a nozzle for spraying cleaning solution onto the wafer, a cover for covering an upper part of the chamber, a heating lamp fixed on an upper part of the cover for heating the wafer or the cleaning solution, a cooling water conduit surrounding the cover, and an antipollution plate mounted on a lower part of the heating lamp in the cover for preventing the heating lamp from being polluted by the cleaning solution. According to an embodiment of the present invention, the cleaning solution, preferably of ozone water, hydrogen water, or electrolytic-ionized water, is heated for a short time and used to clean the wafer.

7 Claims, 3 Drawing Sheets

APPARATUS FOR CLEANING SEMICONDUCTOR WAFER AND METHOD FOR CLEANING WAFER USING THE SAME

BACKGROUND OF THE INVENTION

1. Field of the Invention

The present invention relates to a semiconductor device and to a method for fabricating a semiconductor device using the same. More specifically, the present invention relates to an apparatus for cleaning a semiconductor wafer and to a method for cleaning a wafer using the same.

2. Description of the Related Art

Semiconductor devices are ordinarily cleaned using cleaning solutions such as standard cleaning 1 (a mixed solution of hydrogen peroxide, ammonium hydroxide and deionized water), hydrofluoric acid (HF) and a sulfuric peroxide mixture (SPM). These conventional cleaning solutions contain strong chemicals that cause corrosion of a metal layer of the semiconductor device. Therefore, it is necessary to develop new cleaning solutions with the cleaning ability of the conventional solutions but which minimize corrosion of the metal layer.

Ozone water, hydrogen water, and electrolytic-ionized water have recently been studied as cleaning solutions capable of meeting this need. The ozone water and the hydrogen water cleaning solutions are used by dissolving an ozone gas or a hydrogen gas, respectively, that occurs as a result of electrolyzing deionized water, in the deionized water. The electrolytic-ionized water cleaning solution is used by oxidation water and reduction water that occur as a result of electrolyzing deionized water. In the ozone water, the hydrogen water, and the electrolytic-ionized water, it is advantageous to comparatively free control pH and oxidation-reduction potential by using a gas dissolved in the solution or by an electrolytic current during electrolysis. The ozone water, the hydrogen water, and the electrolytic-ionized water can each remove impurities without corrosion of the metal layer using pH and oxidation-reduction potential.

However, the cleaning ability of the ozone water, the hydrogen water, or the electrolytic-ionized water is minor when used at a normal temperature. Raising the temperature of the ozone water, the hydrogen water, or the electrolytic-ionized water increases its cleaning ability. However, if the ozone water, the hydrogen water, or the electrolytic-ionized water is heated for too long or left alone in the opened state, gases in the cleaning solution evaporate shortening the lifespan of the cleaning solution. Also, because heating the ozone water, the hydrogen water, or the electrolytic-ionized water for a long time dramatically reduces its cleaning ability, it is necessary to heat the cleaning solution rapidly, and to use the heated cleaning solution immediately after heating to clean the wafer.

SUMMARY OF THE INVENTION

In order to solve the aforementioned problems, it is a feature of an embodiment of the present invention to provide an apparatus for cleaning a semiconductor wafer by heating a cleaning solution for a short time.

It is another feature of an embodiment of the present invention to provide a method for cleaning a wafer using the apparatus for cleaning a semiconductor wafer.

In an effort to provide for these and other features of the present invention, there is provided an apparatus for cleaning a semiconductor wafer, which includes a chamber on which a wafer is mounted; a revolving chuck mounted in the chamber for supporting and fixing the wafer; a nozzle for spraying cleaning solution onto the wafer, wherein the cleaning solution may be ozone water, hydrogen water, or electrolytic-ionized water; a cover for covering an upper part of the chamber; a heating lamp which is fixed on an upper part of the cover for heating the wafer or the cleaning solution and which may be an ultraviolet or an infrared, rod-shaped lamp having a length equal to the radius of the wafer; a cooling water conduit surrounding the cover; and an antipollution plate which is preferably made of transparent quartz or sapphire mounted on a lower part of the heating lamp in the cover for preventing the heating lamp from being polluted by the cleaning solution.

In accordance with another feature of the present invention, there is provided an apparatus for cleaning a semiconductor wafer, which includes a chamber on which a wafer is mounted; a revolving chuck mounted in the chamber for supporting and fixing the wafer; a nozzle for spraying cleaning solution onto the wafer, the cleaning solution may be ozone water, hydrogen water, or electrolytic-ionized water; a cover for covering an upper part of the chamber; a laser fixed on an upper part of the cover for heating the wafer or the cleaning solution, the laser may be an ultraviolet, an infrared, or a visible ray laser; and a focusing lens for condensing a beam emitted from the laser onto the wafer.

The apparatus may further include an antipollution plate preferably made of transparent quartz or sapphire mounted on a lower part of the focusing lens in the cover for preventing the focusing lens from being polluted by the cleaning solution.

In accordance with another feature of the invention there is provided a method for cleaning a wafer including providing one of the above-described apparatuses for cleaning a semiconductor wafer; rotating a wafer at a predetermined speed; spraying cleaning solution of ozone water, hydrogen water, or electrolytic-ionized water onto the wafer through a nozzle; heating the wafer or the cleaning solution by a heating lamp or a laser, depending on the apparatus used; and cleaning the wafer.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF THE PREFERED EMBODIMENTS

Korean Patent Application No. 01-2065, filed on Jan. 13, 2001, and entitled: "Apparatus for Cleaning Semiconductor Wafer and Method for Cleaning Wafer Using the Same," is incorporated by reference herein in its entirety.

The present invention will be described more fully hereinafter with reference to the accompanying drawings in which preferred embodiments of the present invention are shown. The present invention may, however, be embodied in many different forms and should not be construed as being limited to the embodiments set forth herein. Rather, these embodiments are provided so that this disclosure will be thorough and complete, and will fully convey the scope of the invention to those of ordinary skill in the art.

Figure 1:
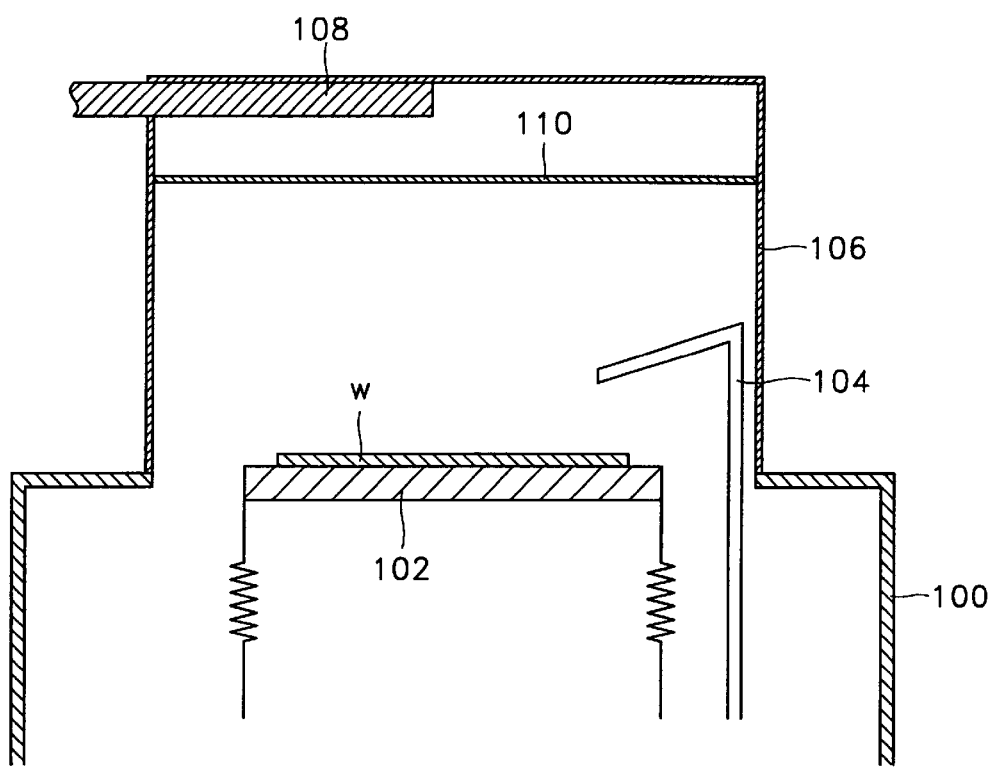
FIG. 1 illustrates a sectional view of an apparatus for cleaning a semiconductor wafer according an embodiment of the present invention.
Figure 2:
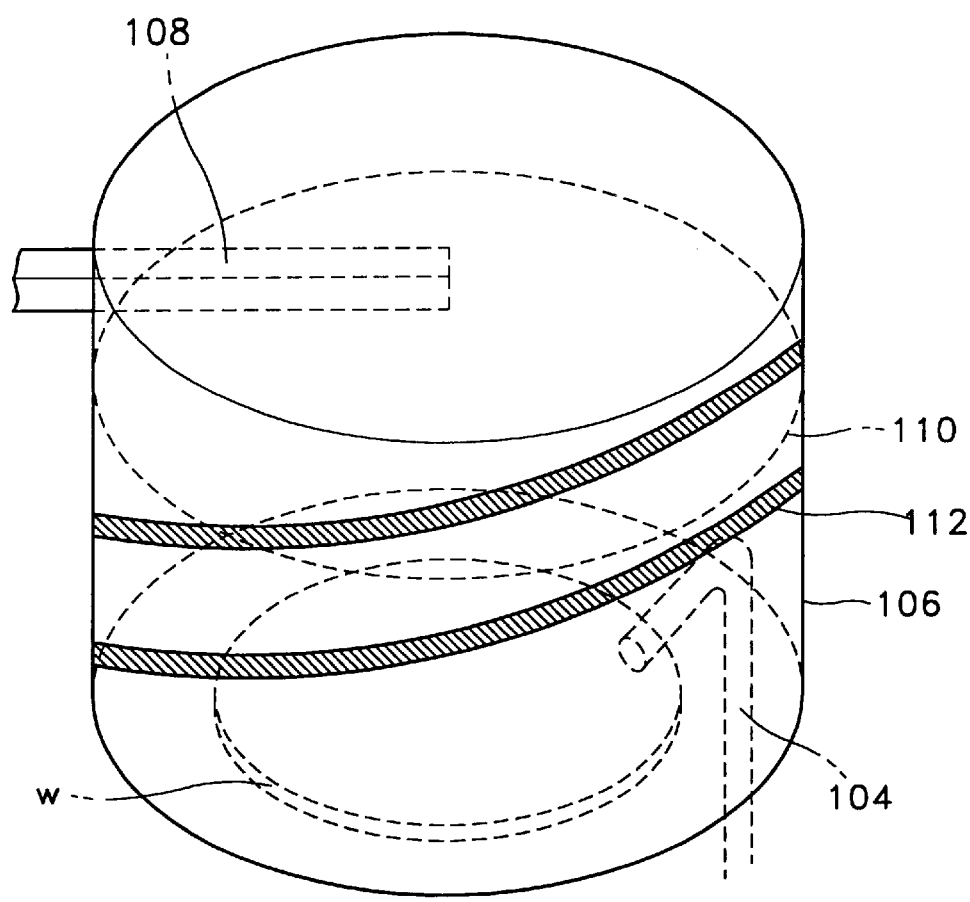
FIG. 2 illustrates a cover of an apparatus for cleaning a semiconductor wafer according to an embodiment of the present invention.

FIG. 1 illustrates a sectional view of an apparatus for cleaning a semiconductor wafer according to an embodiment of the present invention and FIG. 2 illustrates a cover of the apparatus for cleaning a semiconductor wafer according to the same embodiment of the present invention. In FIG. 2, members marked with a dotted line in the cover are illustrated for clarity of explanation of the present invention. Referring to FIGS. 1 and 2, spin-type single wafer processing equipment is the apparatus used for cleaning a semiconductor wafer according to an embodiment of the present invention. The apparatus for cleaning a semiconductor wafer includes a chamber 100 in which a wafer W is mounted. A chuck 102 for supporting and fixing the wafer W is mounted on the chamber 100. The wafer W is mounted on the chuck 102, and the chuck 102 is rotatable. Also, a nozzle 104 for spraying cleaning solution onto the wafer W is mounted in the chamber 100. The cleaning solution, which is preferably ozone water, hydrogen water, or electrolytic-ionized water, is sprayed onto the wafer W by the nozzle 104. A cover 106 for covering the chamber 100 is mounted on an upper part of the chamber 100. A heating lamp 108 for heating the wafer W or the cleaning solution is mounted on an upper part of the cover 106. The heating lamp 108 may be an ultraviolet or an infrared rod-shaped lamp, and preferably having a length equal to the radius of the wafer W. Controlling the power of the heating lamp 108 controls the temperature of the cleaning solution and the wafer W. An antipollution plate 110 is mounted on a lower part of the heating lamp 108. The antipollution plate 110 prevents the heating lamp 108 from being polluted when the cleaning solution is sprayed onto the wafer W by the nozzle 104 and, preferably, the antipollution plate 110 is made of transparent quartz or sapphire. A cooling water conduit 112, from which cooling water flows, surrounds an external wall of the cover 106. The cooling water cools the cover 106, the wafer W, and the cleaning solution that were heated by the heating lamp 108.

Figure 3:
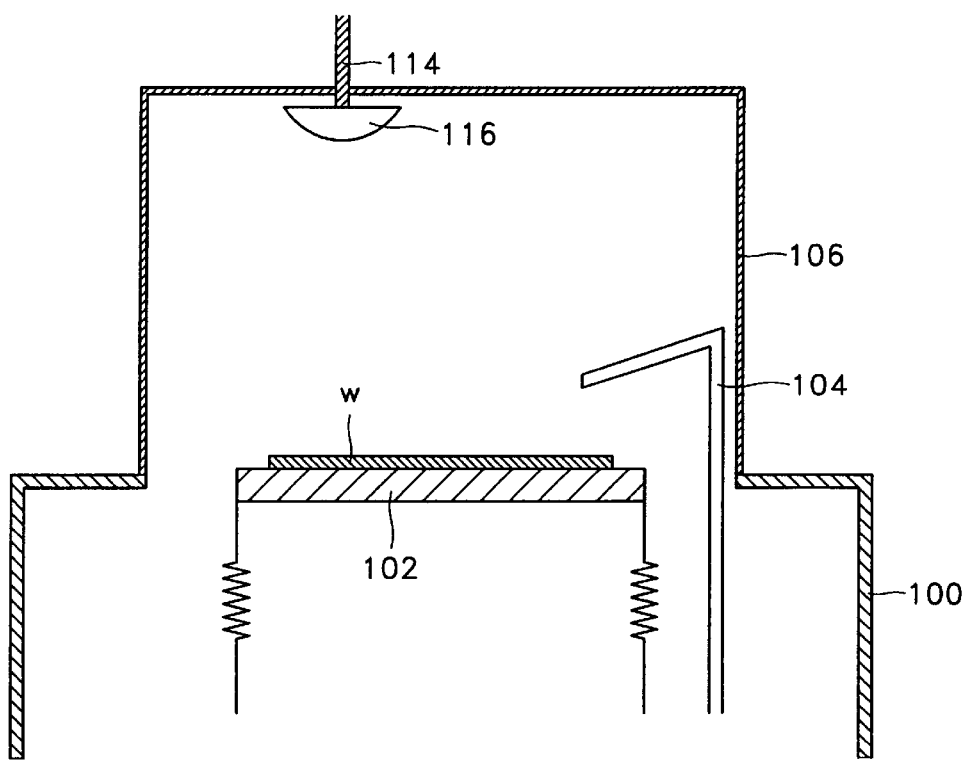
FIG. 3 illustrates a sectional view of an apparatus for cleaning a semiconductor wafer according to another embodiment of the present invention.

According to another embodiment of the present invention, spin-type single wafer processing equipment is the apparatus used for cleaning a semiconductor wafer. FIG. 3 illustrates a sectional view of said apparatus. The apparatus for cleaning a semiconductor wafer includes a chamber 100 on which a wafer W is mounted. A chuck 102 for supporting and fixing the wafer W is mounted on the chamber 100. The wafer W is mounted on the chuck 102, and the chuck 102 is rotatable. Also, a nozzle 104 for spraying cleaning solution onto the wafer W is mounted in the chamber 100. The cleaning solution of ozone water, hydrogen water, or electrolytic-ionized water, is sprayed onto the wafer W by the nozzle 104. A cover 106 for covering the chamber 100 is mounted on an upper part of the chamber 100. A laser 114 for heating the wafer W or the cleaning solution is mounted on an upper part of the cover 106. The laser 114 may be an ultraviolet laser, an infrared laser, or a visible ray laser. A focusing lens 116 for condensing a beam emitted from the laser 114 onto the wafer W is mounted in the laser 114. An antipollution plate (not shown) may be mounted on a lower part of the focusing lens 116. The antipollution plate prevents the focusing lens 116 from being polluted when the cleaning solution is sprayed onto the wafer W by the nozzle 104 and, preferably, the antipollution plate 110 is made of transparent quartz or sapphire.

The present invention also provides a method for cleaning a wafer using the apparatuses for cleaning a semiconductor wafer by first providing one of the apparatuses described above and then by using the following procedure. Rotating the chuck 102 rotates the wafer W mounted on the chuck 102. The cleaning solution is sprayed onto the rotating wafer W by the nozzle 104. The wafer W and the cleaning solution are heated by the heating lamp 108 or the laser 114 of the respective apparatus for cleaning a semiconductor wafer. The temperature of the cleaning solution of ozone water, hydrogen water, or electrolytic-ionized water, can be raised to a process temperature rapidly by the heating lamp 108 or the laser 114. Preferably, the process temperature is between 20 and 85° C. Since gases and ions dissolved in the cleaning solution are important for cleaning the wafer, it is preferable that the cleaning solution of ozone water, hydrogen water, or electrolytic-ionized water is heated for a short time and quickly used. Thus, the wafer W is cleaned by heating the cleaning solution using the heating lamp 108 or the laser 114 and spraying, or by heating the wafer W and increasing the interfacial temperature of the wafer W and the cleaning solution. Controlling the power of the heating lamp 108 or the laser 114, or by controlling the rotation number of the wafer W or the amount of the supplied cleaning solution can control the process temperature.

The ozone water or hydrogen water cleaning solution is used by dissolving ozone gas or hydrogen gas, respectively, in the de-ionized water. Ozone gas or hydrogen gas occur as a result of electrolyzing deionized water. The electrolytic-ionized water cleaning solution is used by oxidation water and reduction water that occur as a result of electrolyzing deionized water. In ozone water, hydrogen water, and electrolytic-ionized water, pH and oxidation reduction potential can be controlled by the amount of gas dissolved in the solution, or by the amount of electrolytic current during electrolysis. Ozone water, hydrogen water, and electrolytic-ionized water can each remove impurities without corrosion of the metal layer using pH and oxidation-reduction potential.

The apparatus for cleaning a semiconductor wafer and method for cleaning a wafer using the same according to an embodiment of the present invention cleans the wafer by heating the cleaning solution of ozone water, hydrogen water, or electrolytic-ionized water for a short time. Because the cleaning solution in the present invention can be heated for a short time and immediately used, the cleaning ability of the present invention is improved over that of the prior art in which the cleaning solution can be left alone in the opened state or heated for too long. Additionally, the process time using the present invention can be reduced over that of the prior art. Further, the wafer can be cleaned without corrosion of the metal layer by using ozone water, hydrogen water, or electrolytic-ionized water as the cleaning solution.

While the present invention has been described in terms of preferred embodiments, those of ordinary skill in the art will recognize that various modifications may be made to the invention without departing from the spirit and scope of the invention as defined by the appended claims.

What is claimed is:

1. An apparatus for cleaning a semiconductor wafer comprising:
    a chamber on which a wafer is mounted;
    a revolving chuck mounted in the chamber, for supporting and fixing the wafer;
    a nozzle for spraying cleaning solution onto the wafer;
    a cylindrical cover for covering an upper part of the chamber;
    a heating lamp fixed on an upper part of the cover, for heating the wafer or the cleaning solution;
    a cooling water conduit surrounding an external wall of the cylindrical cover by encircling the cylindrical cover at least once, for cooling the cover, the wafer, and the cleaning solution; and
    an antipollution plate mounted on a lower part of the heating lamp in the cylindrical cover, for preventing the heating lamp from being polluted by the cleaning solution.

2. The apparatus according to claim 1, wherein the heating lamp is an ultraviolet or an infrared lamp.

3. The apparatus according to claim 1, wherein the heating lamp is a rod-shaped lamp having a length equal to the radius of the wafer.

4. The apparatus according to claim 1, wherein the antipollution plate is made of transparent quartz or sapphire.

5. The apparatus according to claim 1, wherein the cleaning solution is ozone water, hydrogen water, or electrolytic-ionized water.

6. A method for cleaning a wafer using an apparatus for cleaning a semiconductor wafer according to claim 1, the method comprising:
    rotating the wafer at a predetermined speed;
    spraying cleaning solution onto the wafer through a nozzle;
    heating the wafer or the cleaning solution by a heating lamp; and
    cleaning the wafer.

7. The method according to claim 6, wherein the cleaning solution is ozone water, hydrogen water, or electrolytic-ionized water.

* * * * *